United States Patent
Braceras et al.

(10) Patent No.: US 6,509,778 B2
(45) Date of Patent: Jan. 21, 2003

(54) BIST CIRCUIT FOR VARIABLE IMPEDANCE SYSTEM

(75) Inventors: George M Braceras, Essex Junction, VT (US); Steven Burns, Essex Junction, VT (US); Patrick R. Hansen, Essex Junction, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/809,566

(22) Filed: Mar. 15, 2001

(65) Prior Publication Data

US 2002/0130697 A1 Sep. 19, 2002

(51) Int. Cl.[7] .......................................... H03K 19/0175
(52) U.S. Cl. .......................... 327/308; 327/306; 326/87
(58) Field of Search ................................ 327/306, 308, 327/50, 108; 326/87, 86, 30

(56) References Cited

U.S. PATENT DOCUMENTS

| | | | |
|---|---|---|---|
| 5,418,738 A | 5/1995 | Abadeer et al. | ............ 365/100 |
| 5,504,434 A | 4/1996 | Schepis et al. | ............ 324/719 |
| 5,666,078 A | 9/1997 | Lamphier et al. | ............ 327/108 |
| 5,892,716 A | 4/1999 | Ingalls | ............ 365/189.05 |
| 5,952,833 A | 9/1999 | Morgan | ............ 324/537 |
| 6,163,499 A | * 12/2000 | Suzuki | ............ 365/30.06 |
| 6,166,563 A | * 12/2000 | Volk et al. | |

* cited by examiner

Primary Examiner—Dinh T. Le
(74) Attorney, Agent, or Firm—McGinn & Gibb, PLLC; Robert A. Walsh, Esq.

(57) ABSTRACT

Disclosed is a programmable impedance driver that includes two sets of impedance devices, two primary counters and two test counters. The primary counters selectively activate individual ones of the impedance devices to vary an overall impedance of the driver and the test counters verify the counting operation of the primary counters during manufacturing testing of the driver. Therefore, the built-in self-test (BIST) aspect of the invention easily detects if one of the counters will become stuck during normal usage.

14 Claims, 4 Drawing Sheets

BIST CIRCUIT FOR VARIABLE IMPEDANCE SYSTEM

BACKGROUND OF THE INVENTION

1. Field of the Invention

The present invention generally relates to test systems for integrated circuits and more particularly to a built in self test circuit for a variable impedance system.

2. Description of the Related Art

In electrical systems, output drivers are used to drive input/output (I/O) devices or similar loads. Each output driver is set up with a certain voltage/impedance that matches the strength of the transmission line and I/O device being driven by that specific driver. Thus, I/O devices with a low drive strength would need an output driver with a high impedance, and high strength I/O devices require a low impedance driver. Since some output drivers have only one impedance rating, an output driver driving a load other than the one it is designed for would result in too much or too little of the strength needed.

In addition, output driver impedance variations as a result of supply voltage, temperature, and process variations may be as high as 100% of the desired impedance. Consequently, such a system would suffer in performance from factors such as slow downs of a high performance system and/or dissipation of dc power. The mismatch between the SRAM output driver and the characteristic line impedance of the system is very undesirable in high performance and small signal applications, such as cache to processor I/O interfaces. Furthermore, if a separate part was designed for the many different load strengths across different systems, the costs may become expensive.

One solution to overcome using several single impedance output drivers is to use one output driver with a variable resistor external to the output driver (discussed in greater detail below with respect to FIG. 1). With such a driver, a user may change the external resistor of the driver to reflect the voltage/impedance needed to drive a load.

The driver needs to have an impedance that matches the transmission line being driven. The overall impedance of the driver circuit is obtained through the circuit's "count", as discussed in greater detail below. However, as the impedance tolerance of such drivers varies, the system's performance degrades and testing such drivers has proved a difficult proposition. Accordingly, a need has developed in the art for a programmable impedance output driver circuit that will not only provide a variable impedance in its circuitry, but will also be easily tested for defects.

Another advantage of variable impedance drivers is the ability to meet different impedance requirements with the same chip. For example, the same chip can provide a 35-Ω driver for one application and a 70-Ω driver for another application. The only difference between the two applications is the value of the external variable resistor.

SUMMARY OF THE INVENTION

In view of the foregoing, it is an object of the invention to provide a programmable impedance driver that includes two sets of impedance devices, two primary counters operatively connected to respective ones of the sets of the impedance devices (the primary counters selectively activate individual ones of the impedance devices to vary an overall impedance of the driver), and two test counters. The test counters verify an operation of the primary counters during manufacturing testing of the driver.

The invention also includes two comparators receiving signals from respective ones of the primary counters and respective ones of the test counters. These comparators determine if respective pairs of the primary counters and the test counters have identical counts. A test output pin is connected to the comparators and outputs a signal indicating a functionality of the primary counters.

The sets of impedance devices includes p-type field effect transistors (PFET) and n-type field effect transistors (NFET). Similarly, the primary counters include a PFET primary counter and an NFET primary counter and the test counters include a PFET test counter and an NFET test counter.

The invention also includes test control logic connected to the PFET primary counter, the NFET primary counter, the PFET test counter, and the NFET test counter. The test control logic resets the PFET primary counter and the PFET test counter to all zero at the start of testing and resets the NFET primary counter and the NFET test counter to all ones at the start of testing. During testing, the PFET primary counter and the PFET test counter are initially incremented, and the NFET primary counter and the NFET test counter are initially decremented.

Thus, the invention includes two primary counters and two test counters. The primary counters selectively activate individual ones of the impedance devices to vary an overall impedance of the driver during normal use and the test counters verify the counting operation of the primary counters during manufacturing testing of the driver. Therefore, the built-in self-test (BIST) aspect of the invention easily detects if one of the counters will become stuck during normal usage. The invention achieves greater than 90% testability of variable impedance systems found in high-speed ICs. The need for on-chip circuitry to test the variable impedance circuit arises from the inability to test this circuit during manufacturing. The invention achieves a high degree of testability without compromising accuracy of the impedance circuit and uses an existing state machine (e.g., JTAG) to accomplish the testing. Furthermore, the added logic to accomplish a high degree of testability is kept to a minimum and is very easily integratable into the existing variable impedance system.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

In general terms, the invention is a programmable impedance driver that includes two sets of impedance devices, two primary counters and two test counters. The primary counters selectively activate individual ones of the impedance devices to vary an overall impedance of the driver during normal operation and the test counters verify the counting operation of the primary counters during manufacturing testing of the driver. Therefore, the built-in self-test (BIST) aspect of the invention easily detects if one of the counters will become stuck during normal usage.

The invention also includes two comparators receiving signals from the primary counters and the test counters that determine if respective pairs of the primary counters and the test counters have identical counts. A test output pin is connected to the comparators and outputs a signal indicating a functionality of the primary counters.

The sets of impedance devices include p-type field effect transistors (PFET) and n-type field effect transistors (NFET). Similarly, the primary counters include a PFET primary counter and an NFET primary counter and the test counters include a PFET test counter and an NFET test counter. Test control logic resets the PFET primary counter and the PFET test counter to all zero at a start of testing and resets the NFET primary counter and the NFET test counter to all ones at the start of testing. During testing, the PFET primary counter and the PFET test counter are incremented, and the NFET primary counter and the NFET test counter are decremented.

Figure 1:
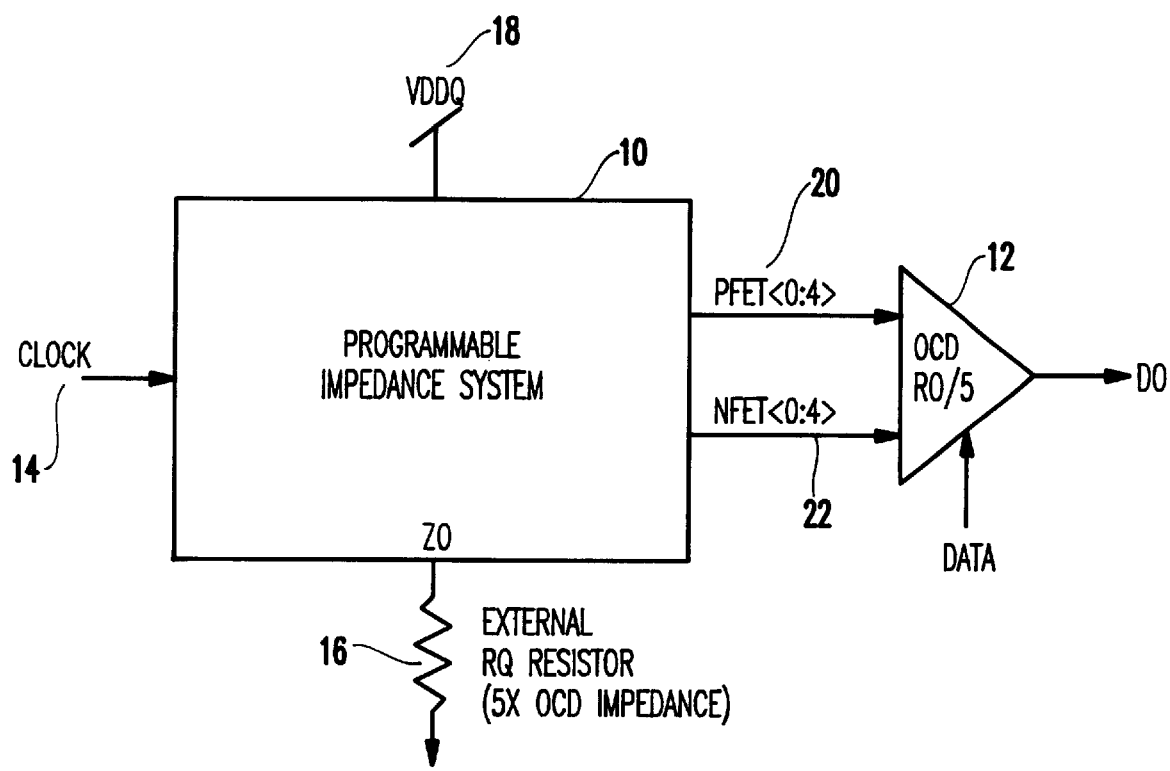
FIG. 1 is a schematic diagram of a variable impedance system.

FIG. 1 shows a schematic circuit block diagram of a variable impedance circuit that includes a programmable impedance system 10 which is supplied with a clock signal 14. The programmable impedance system 10 is connected to a voltage source VDDQ 18 and an external resistor RQ 16. The impedance system outputs five p-type field effect transistor (PFET) signals 0–4 (20) and five n-type field effect transistor (NFET) signals 0–4 (22) to a driver 12 which drives the DQ signal having the desired impedance. While five fingers are shown in this example, as would be known by one ordinarily skilled in the art, any number of fingers could be used.

Figure 2:
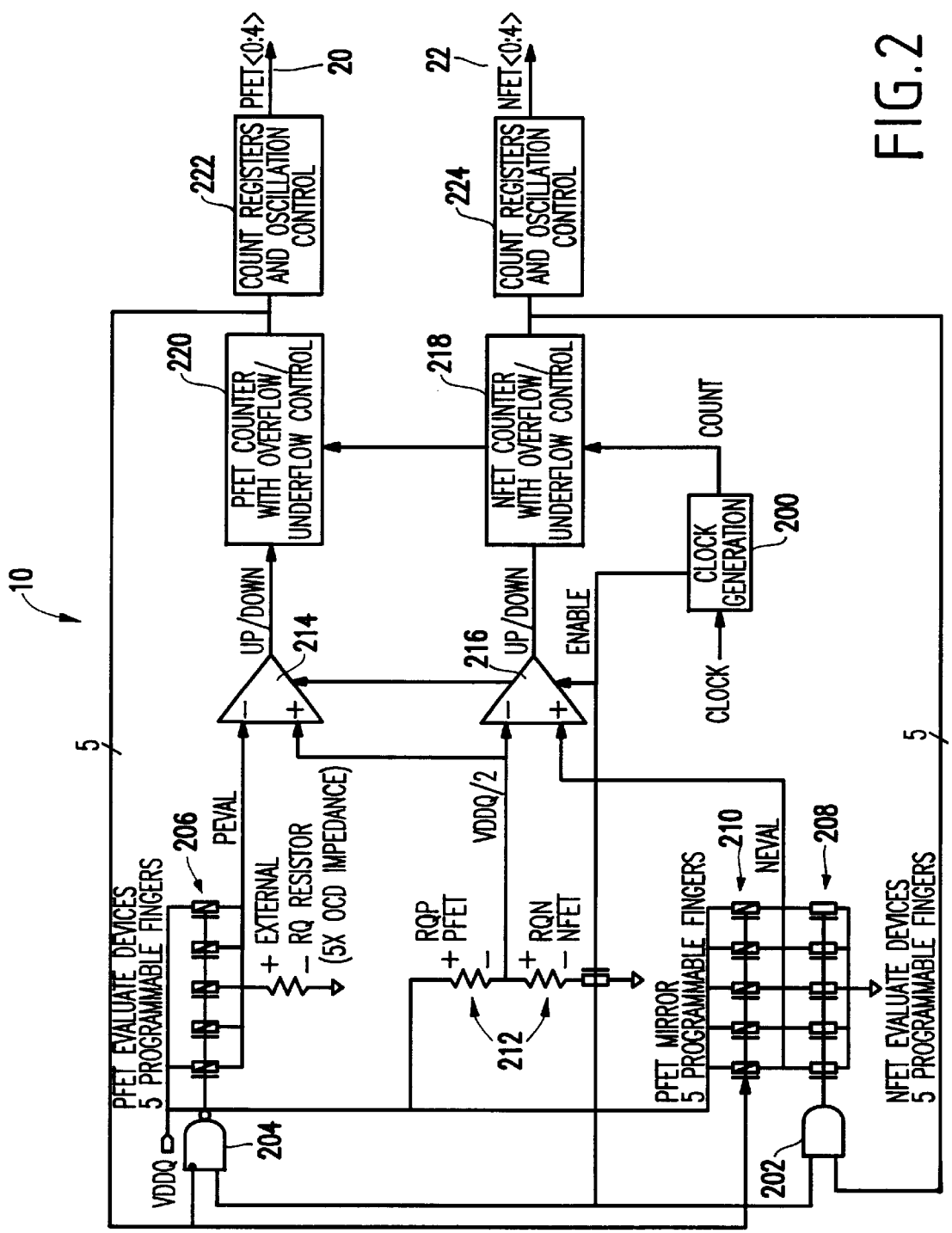
FIG. 2 is a schematic diagram illustrating the details of one programmable impedance system shown in FIG. 1.

FIG. 2 illustrates the operation of one programmable impedance system 10. As shown in FIG. 2, a clock generation unit 200 receives a clock signal and outputs an enable signal to a group of five AND gates 202 and a group of five NAND gates 204 as well as a count signal to NFET counter 218 and PFET counter 220. The enabled signal is utilized to selectively activate the programmable impedance system 10 periodically, so as to conserve power.

Programmable fingers 206, 208, 210 (which are binarily weighted devices) are utilized to adjust the impedance of the output driver 12. More specifically, the output from the programmable fingers 206, 208, 210 is compared using comparators 214, 216 to a voltage VDDQ/2 produced by a voltage divider 212. If the PFET impedance is too low or too high, the counter 220 adjusts by disconnecting or connecting ones of the programmable fingers 206 through NAND gates 204 and changes the count in the counter accordingly. The NFET counter 218 similarly connects or disconnects the programmable fingers 208 through AND gates 202. Programmable fingers 210 provide a mirroring reference to NFET programmable fingers 208 from PFET programmable fingers 206.

PFET counter 220 counts up to enable more PFBT transistors 206 in order to bring the PEVAL voltage higher. Conversely, 220 can count down to disable PFET transistors and bring PEVAL voltage lower. Similarly, NFET counter 218 counts higher (lower) to enable more NFET transistors (208) and bring NEVAL lower (higher).

Once the impedance is balanced, oscillation control devices 222, 224 prevent undesirable oscillations when the correction lies somewhere between finger selections and eventually the impedance of the signals 20, 22 are output from the circuit, to control the chip's output driver 12.

However, the programmable impedance system 10 shown in FIG. 2 may encounter undetectable defects if, for example, a fault occurs in the PFET counter 220 or NFET counter 218. More specifically, even with these defects, the impedance control signals from the circuit may appear acceptable in a testing environment. However, when such a circuit is applied to real usage requirements, the defective counter 220, 218 would become apparent.

For example, if PFET counter 220 bit #3 is stuck low, but the actual correct count for a 50-Ω impedance is 00111 (PFET4–PFET0) then when the device is tested at 50-Ω the correct impedance is measured. However, if the application calls for a 52-Ω driver or 01000 on PFET4–0; since bit #3 is stuck low, the output to the driver is 0000 which produces a much lower impedance. Other defects in circuits/wiring of 204, 206, 214, 216, 210, 208 may also go undetected. As discussed below, the invention properly detects a stuck counter and avoids these otherwise "undetectable" defects.

Figure 3:
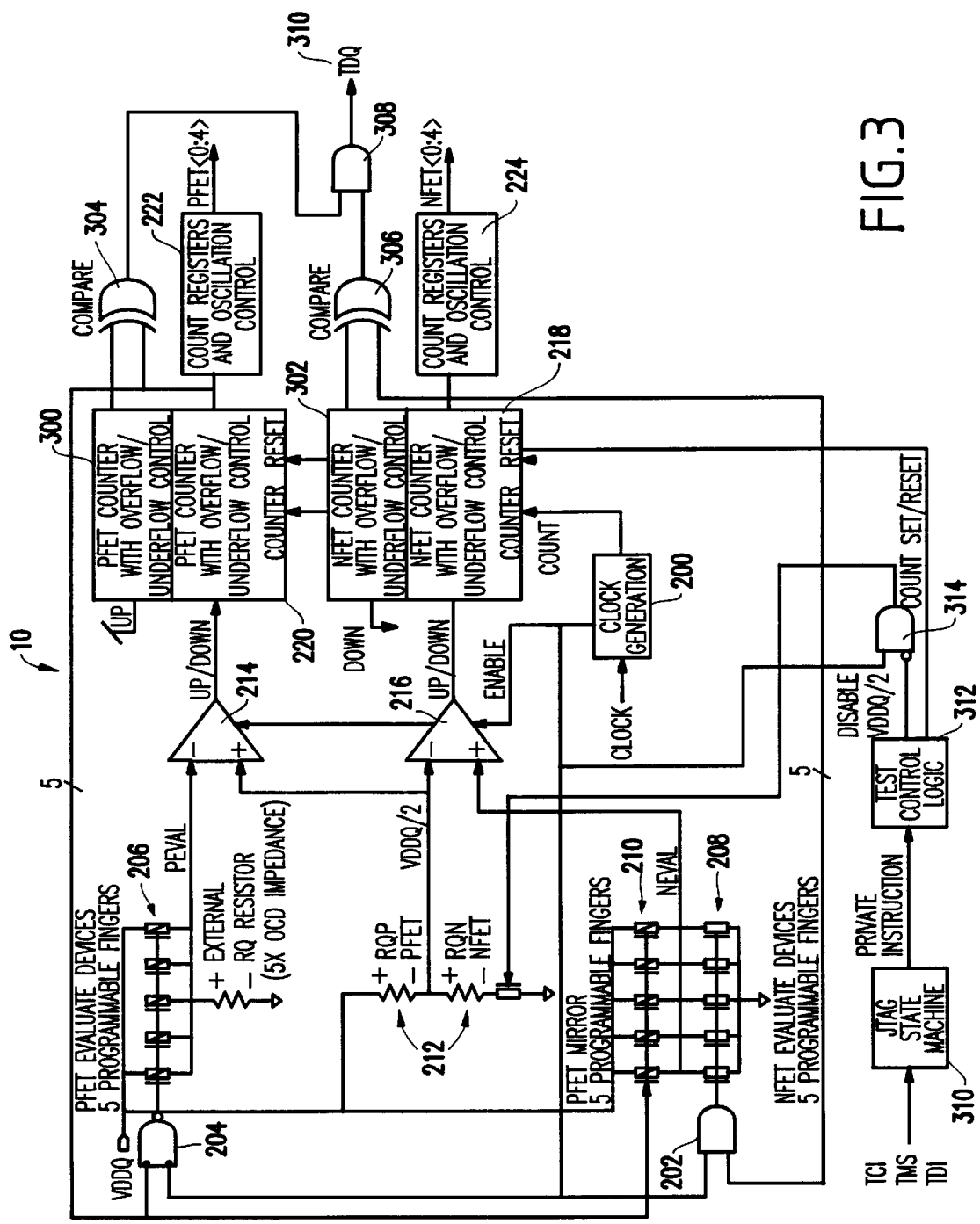
FIG. 3 is a schematic diagram illustrating the details of another programmable impedance system shown in FIG. 1.

FIG. 3 illustrates a programmable impedance system 10 which includes additional elements to prevent the problems that may occur in the system shown in FIG. 2. More specifically, the items which are similar between FIG. 2 and FIG. 3 are identified with the same numbers. The system in FIG. 3 includes additional counters 300, 302 and comparators 304, 306 that compare the output of the original counters 222, 218 to the new counters 300, 302 to ensure that the counters 220, 218 do not become stuck. The signals produced by the comparators 304, 306 are combined in an AND gate 308 to determine if both counters 220, 218 are operating properly. In addition, the circuit in FIG. 3 includes a state machine 310 and test control logic 312 which processes private instruction from the state machine 310.

The test control logic 312 resets the counters 218, 220, 300, 302 and controls the voltage divider 212. More specifically, the JTAG private instruction is invoked from the JTAG state machine 310 and processed through the test control logic 312 to disable the VDDQ/2 voltage divider 212, and reset the PFET counters 220, 300 to all 0's and set the NFET counters 218, 302 to all 1's. As a result, the VDDQ/2 voltage divider 212 drives to VDDQ; thus forcing the comparator 214 to increase the count in the PFET counters 220, 300 and forcing the comparator 216 to decrease the count in the NFET counters 218, 302.

The chip clock starts running to begin the evaluation process. Periodically (e.g., every 64 cycles) an evaluation is performed which increases the PFET count 220 by one bit and decreases NFET count 218 by one bit. PFET and NFET "test" counters 300, 302 are also incremented/decremented at the same time the evaluation occurs. This test evaluation continues counting until all PFET and NFET devices are counted. By utilizing redundant counters, if one of the counters becomes stuck, the discrepancy between the redundant counter and the original counter will be identified by the comparators 304, 306 and an error signal will be produced by the AND gate 308. Therefore, this embodiment of the invention clearly identifies if a counter will become stuck at any possible count.

In a preferred embodiment, the TDO pin 316 is strobed periodically (e.g., every 64 cycles) to confirm the functionality of the evaluation path. In this manner, every count step of both PFET and NFET evaluations are thoroughly tested until all counts are confirmed. Both "test" and evaluation counters have overflow/underflow protection so that further comparisons beyond the maximum counts will result in a match. In other words, the highest number that can be counted would be equal to a binary count counting all fingers (incrementing or decrementing).

For every evaluation that occurs every 64 cycles, the counters are incremented or decremented by only one count. Initially, PFET counters are reset to 0s. After the first evaluation, the count increases by one to 00001. Every evaluation keeps incrementing the counter by one count until 11111 is reached.

Figure 4:
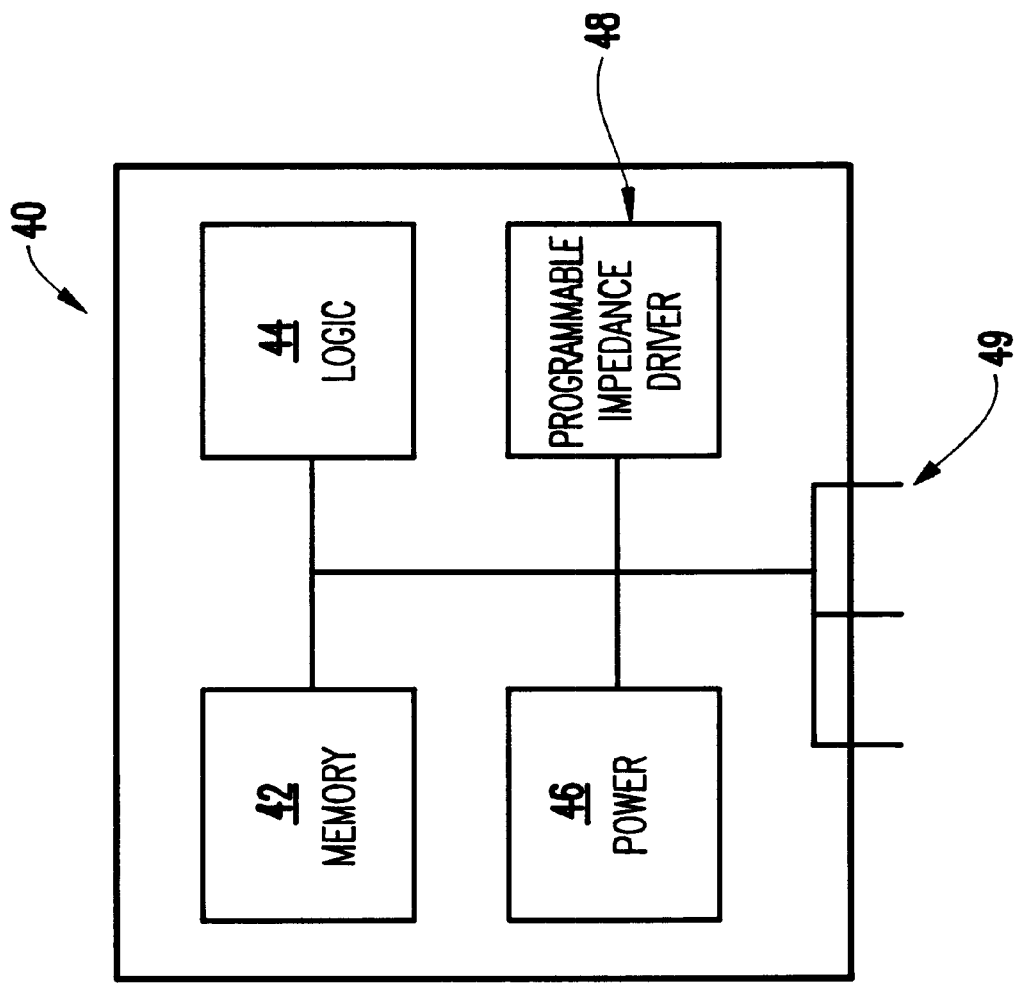
FIG. 4 is a schematic diagram of an integrated circuit board using the inventive programmable impedance system.

FIG. 4 illustrates an integrated circuit board 40 that can be used with the invention.

More specifically, the integrated circuit board 40 can include one or more memory elements 42, logic circuits 44, power devices 46, etc. The board 40 may include these or other elements depending upon the ultimate design/function of the board 40. The circuit board 40 commonly includes input/output pins 49 and wiring to connect the various devices on the board. The inventive programmable impedance driver is shown schematically as a separate item 48 in FIG. 4; however, as would be well known to those ordinarily skilled in the art given this disclosure, there could be many drivers 48 on the board 40, and the driver(s) 48 could be incorporated into any of the other elements shown.

Thus, the invention includes two primary counters and two test counters. The primary counters selectively activate individual ones of the impedance devices to vary an overall impedance of the driver and the test counters verify the counting operation of the primary counters during manufacturing testing of the driver. Therefore, the built-in self-test (BIST) aspect of the invention easily detects if one of the counters will become stuck during normal usage. The invention achieves greater than 90% testability of variable impedance systems found in high-speed ICs. The need for on-chip circuitry to test the variable impedance circuit arises from the inability to test this circuit during manufacturing. The invention achieves a high degree of testability without compromising accuracy of the impedance circuit and uses an existing state machine (e.g., JTAG) to accomplish the testing. Furthermore, the added logic to accomplish a high degree of testability is kept to a minimum and is very easily integratable into the existing variable impedance system.

While the invention has been described in terms of preferred embodiments, those skilled in the art will recognize that the invention can be practiced with modification within the spirit and scope of the appended claims.

The invention may also be extended to various generic analog to digital convertors in which analog voltages are converted to digital signals with the aid of counters.

What is claimed is:

1. A programmable impedance control circuit for controlling the impedance of a driver circuit comprising:
    at least two sets of impedance devices, a first set comprising p-type field effect transistors (PFET) and a second set comprising n-type field effect transistors (NFET);
    at least two primary counters operatively connected to said sets of impedance devices and to a clock signal, said primary counters comprising a PFET primary counter and an NFET primary counter, said primary counters selectively activating individual ones of said impedance devices to vary the overall impedance of said driver circuit; and
    at least two test counters comprising a PFET test counter and an NFET test counter operatively connected to said clock signal,
    wherein said test counter verifies an operation of said primary counter during manufacturing testing of said driver circuit.

2. The control circuit in claim 1, further comprising at least one comparator receiving signals from said primary counters and said test counters, wherein said comparator determines when said primary counters and said test counters have identical counts.

3. The control circuit in claim 1, further comprising test control logic connected to said PFET primary counter, said NFET primary counter, said PFET test counter, and said NFET test counter,
    wherein said test control logic resets said PFET primary counter and said PFET test counter to all zero at a start of testing and resets said NFET primary counter and said NFET test counter to all ones at said start of testing, and
    wherein during testing, said PFET primary counter and said PFET test counter are incremented, and said NFET primary counter and said NFET test counter are decremented.

4. The control circuit in claim 2, further comprising a test output pin connected to said comparators adapted to provide an output a signal indicating a functionality of said primary counters.

5. A programmable impedance control circuit for controlling the impedance of a driver circuit comprising:
    two sets of impedance devices;
    two primary counters operatively connected to respective ones of said sets of said impedance devices and to a clock signal, said primary counters selectively activating individual ones of said impedance devices to vary an overall impedance of said driver circuit, and
    two test counters operatively connected to said clock signal,
    wherein said test counters verify an operation of said primary counters during manufacturing testing of said driver circuit.

6. The control circuit in claim 5, further comprising two comparators receiving signals from respective ones of said primary counters and respective ones of said test counters, wherein said comparators determine when respective pairs of said primary counters and said test counters have identical counts.

7. The control circuit in claim 5, wherein said sets of impedance devices includes a first set comprising p-type field effect transistors (PFET) and a second set comprising n-type field effect transistors (NFET).

8. The control circuit in claim 7, wherein said primary counters include a PFET primary counter and an NFET primary counter and said test counters include a PFET test counter and an NFET test counter.

9. The control circuit in claim 9, further comprising test control logic connected to said PFET primary counter, said NFET primary counter, said PFET test counter, and said NFET test counter,
    wherein said test control logic resets said PFET primary counter and said PFET test counter to all zero at a start of testing and resets said NFET primary counter and said NFET test counter to all ones at said start of testing, and
    wherein during testing, said PFET primary counter and said PFET test counter are initially incremented, and said NFET primary counter and said NFET test counter are initially decremented.

10. The control circuit in claim 6, further comprising a test output pin connected to said comparators adapted to output a signal indicating a functionality of said primary counters.

11. An integrated circuit board comprising at least one of memory devices, power devices, and logic devices, said circuit board further comprising at least one programmable impedance driver circuit for controlling the impedance of a driver circuit said programmable impedance driver circuit comprising:

at least two sets of impedance devices, a first set comprising p-type field effect transistors (PFFT) and a second set comprising n-type field effect transistors (NFET);

at least two primary counters operatively connected to said sets of impedance devices and to a clock signal, said primary counters comprising a PFET primary counter and an NFET primary counter, said primary counters selectively activating individual ones of said impedance devices to vary the overall impedance of said driver circuit; and at least two test counters comprising a PFET test counter and an NFET test counter operatively connected to said clock signal, wherein said test counter verifies an operation of said primary counter during manufacturing testing of said driver circuit.

12. The integrated circuit board in claim 11, further comprising at least one comparator receiving signals from said primary counters and said test counters, wherein said comparator determines when said primary counters and said test counters have identical counts.

13. The integrated circuit board in claim 11, further comprising test control logic connected to said PFET primary counter, said NFET primary counter, said PFET test counter, and said NFET test counter, wherein said test control logic resets said PFET primary counter and said PFET test counter to all zero at a start of testing and resets said NFET primary counter and said NFET test counter to all ones at said start of testing, and wherein during testing, said PFET primary counter and said PFET test counter are incremented, and said NFET primary counter and said NFET test counter are decremented.

14. The control circuit in claim 12, further comprising a test output pin connected to said comparators adapted to provide an output a signal indicating a functionality of said primary counters.

* * * * *